United States Patent [19]

Twieg

[11] Patent Number: 4,794,337

[45] Date of Patent: Dec. 27, 1988

[54] METHOD AND APPARATUS FOR MAGNETIC RESONANCE ANALYSIS OF NUCLEAR DISTRIBUTION

[75] Inventor: Donald B. Twieg, Novato, Calif.

[73] Assignee: U.S. Philips Corporation, New York, N.Y.

[21] Appl. No.: 13,319

[22] Filed: Feb. 11, 1987

[30] Foreign Application Priority Data

Feb. 12, 1986 [DE] Fed. Rep. of Germany ....... 3604280

[51] Int. Cl.[4] ............................................. G01R 33/20
[52] U.S. Cl. ................................. 324/309; 324/312; 324/318
[58] Field of Search ............... 324/307, 309, 310, 312, 324/318, 322

[56] References Cited

U.S. PATENT DOCUMENTS

| 4,165,479 | 8/1979 | Mansfield | 324/309 |
| 4,527,124 | 7/1985 | van Uijen | 324/309 |
| 4,651,096 | 3/1987 | Bounocore | 324/309 |
| 4,678,996 | 7/1987 | Haacke et al. | 324/312 |

Primary Examiner—Stewart J. Levy
Assistant Examiner—Kevin D. O'Shea

[57] ABSTRACT

A method for the determination of the spatial and of the spectral distribution of the nuclear magnetization in a region under investigation. Following a high-frequency excitation pulse, a magnetic gradient field periodically varying its polarity is actuated. The resolution is increased in that, even during the periods of time in which the gradient of this field varies, scanning values are recorded and subjected to a Fourier transformation.

9 Claims, 5 Drawing Sheets

F(Kx,Ky,t)  ⟹  f(x,y,v)

METHOD AND APPARATUS FOR MAGNETIC RESONANCE ANALYSIS OF NUCLEAR DISTRIBUTION

BACKGROUND OF THE INVENTION

1. Field of the Invention

The invention relates to a method for the determination of the spatial and of the spectral distribution of the nuclear magnetization in a region under investigation, in which, in the presence of a homogenous steady magnetic field, a number of magnetic field sequences act on the region under investigation, each sequence comprising at least one magnetic high-frequency pulse for the excitation of nuclear magnetic resonance and subsequently a plurality of periods of a magnetic gradient field with a gradient periodically varying its polarity, after which the echo signals generated in this procedure in the region under investigation are converted into digital samples and these are subjected to a discrete Fourier transformation.

2. Description of the Prior Art

Such a method is known (Matsui et al, J.Am.Chem.Soc. 1985, 107, pages 2817 to 2818). Furthermore, the invention relates to an arrangement for carrying out the method.

In this procedure, each sequence comprises two high-frequency pulses, which flip the magnetization vector in the region under investigation by 90° and by 180° respectively from its previous position. Between the two pulses or directly thereafter, for the purpose of the phase coding a gradient field is actuated, the gradient of which is varied from sequence to sequence. After this gradient field has been switched off again, there is a further magnetic gradient field, the gradient of which extends in a direction perpendicular to the (y-)direction of the gradient of the previously mentioned gradient field (i.e. in the x-direction) and varies periodically from a positive to a negative value. After each reversal of the gradient, an echo signal is generated. The echo signals which are generated in the case of positive (or in the case of negative) gradients are converted into digital samples and subjected to a Fourier transformation. The digital samples created in this manner may be classified in each instance in three different groups: The first group comprises the equidistant samples of an echo signal. The second group comprises samples which occur in varying sequences, in each instance in the case of the same echo signal and in the same phase in relation to the periodic gradient field, and the third group comprises the samples which occur in different echo signals of the same sequence, in each instance in the same phase with respect to the gradient field. The temporal interval of the samples of a group is in each instance the same; it is smallest in the first group and greatest in the second group.

The groups, thus obtained, of samples are subjected to a three-dimensional discrete Fourier transformation, which gives the nuclear magnetization in the region under investigation as a function of the position (x, y) and as a function of the frequency (more precisely: as a function of the frequency difference from the central frequency of the high-frequency excitation pulse.

In this procedure, the bandwidth, within which the nuclear magnetization can be recorded, corresponds to the frequency of the magnetic gradient field. If the latter has, for example, a period of 4.992 ms, then this results in a bandwidth of 200.3 Hz. This frequency range can be resolved into a number of subsidiary ranges, the number of which corresponds to the number of periods of the periodic gradient field within a sequence.

In the known method, the periodic gradient field exhibits a practically quandrangular temporal progression, so that the samples are always recorded at points in time at which the gradient is constant and either positive or negative (in reality, the temporal progression is not precisely quandrangular, and indeed the reversal time (50 μs) is shorter than the temporal interval between two samples (78 μs), so that the echo signal is always sampled at points in time at which the gradient is constant and either positive or negative).

The spatial resolution in the direction in which the gradient of the periodic magnetic gradient field extends is restricted; the maximum spatial frequency in this direction is proportional to the temporal integral over the positive or the negative part of the period of the gradient. An increase in this value by increasing the gradient is not possible if the current has already reached its maximum value through the gradient coils by means of which the gradient field is generated. Furthermore, the increasing of the resolution by increasing the period of the periodic gradient field is for practical purposes not possible, because this would result in a decrease in the resolvable bandwith which corresponds to the reciprocal of the period.

In the case of nuclear spin investigation devices for the investigation of the human body, the spatial resolution is, in practice, even more severely restricted. In this connection, the gradient coils must indeed be so large that there is room for a patient between them. As a result of this, they possess a greater inductivity and store more electromagnetic energy than smaller coils. As a result of this, the reversal phase from a positive to a negative gradient (and vice versa) lasts for a substantially greater length of time than in the known method, so that the duration of the reversal phase can amount to a multiple of the temporal interval between two successive samples of an echo signal generated in the region under investigation. In this connection, the sampling of the echo signals must be restricted to the time intervals in which the gradient is constant. However, the temporal integral over the gradient during this interval is (in the case of equal intensity of the gradient and in the case of equal period) even smaller than in the case of a quadrangular progression of the magnetic gradient field, resulting in a reduced resolution.

The object of the present invention is to provide a method with which, on the other hand, in the case of a progression—temporarily differing from the quandrangular form—of the periodic gradient field an improved resolution is obtained, as well as an arrangement for carrying out this method.

SUMMARY OF THE INVENTION

Proceeding from a method of the initially mentioned type, this object is achieved according to the invention in that the temporal progression of the magnetic gradient field differs from the quadrangular form, in that the samples are also recorded which occur when the gradient field varies, and in that these and the remaining samples are allocated to the spatial frequency range and are transformed from the latter by the Fourier transformation into the spatial range.

In the method according to the invention, the echo signals are thus also sampled in the phases in which the gradient of the periodic gradient field varies, in particular thus also in the reversal phases.

If, in this procedure—as is generally usual—the echo signals were converted into digital samples at equidistant points in time, a direct Fourier transformation by means of these samples would lead to errors. In order to avoid this, in the invention the samples are allocated in each instance to the spatial frequencies at which they were recorded. Because of the varied gradient, the samples do not have the same spacing from one another in the spatial frequency range. Accordingly, the Fourier transformation following thereafter must be arranged in such a manner that it can be carried out with reference to function values discretely prescribed at non-equidistant support positions. The terminology "support position" refers to the time location of samples to be used in the transformation. Such Fourier transformation procedures are, however, known, for example from "NTZ Archiv" (NTZ Archives) Vol 3 (1981) No. 2, pages 35 to 38.

The allocation to the spatial frequency range can also take place in that the signal is from the outset sampled in a temporally non-equidistant manner, so that the samples recorded in the course of the procedure have in each instance the same spacing from one another in the spatial frequency range.

An arrangement for carrying out this method, having a magnet for the generation of a homogeneous steady magnetic field, a high-frequency coil for the generation of high-frequency excitation pulses, gradient coils for the generation of magnetic gradient fields with gradients extending in differing directions, a control arrangement for the control of the temporal progression of the fields generated by the gradient coils, a analog to digital converter arrangement for the generation of digital samples from the echo signals, a memory for receiving the samples and a computer for carrying out a Fourier transformation with the samples, is characterized in that the control arrangement is arranged in such a manner that at least one of the gradient coils generates a periodic magnetic field with a temporal progression deviating from the quadrangular form, in that during the intervals of time with a non-constant gradient digital samples are generated by the analog to digital converter arrangement from the echo signals and are stored in the memory, and in that means are provided which convert the sequence of the samples into a sequence—equidistant in the spatial frequency range—of values, which are fed to the computer for the Fourier transformation from the spatial frequency range into the spatial range.

As is known from the initially cited literature reference, only every second echo signal may be evaluated. The remaining echo signals can indeed likewise to combined into a group and subjected to a Fourier transformation, but the effect of the noise may at all events be reduced in this manner. Nevertheless, a halving of the measurement time may be achieved in that a second magnetic gradient field, whose gradient extends perpendicular to the gradient of the first gradient field, is also reversed synchronously with the first gradient field, the variation of the temporal integral over the gradient of the second gradient field being small in comparison with the temporal integral over the resulting gradient of both gradient fields, and in that the echo signals occurring in the case of a positive gradient of the first magnetic gradient field on the one hand and in the case of a negative gradient on the other hand are converted into digital scanning values and subjected separately to a Fourier transformation. In this procedure, in the case of positive polarity of the gradient of the magnetic gradient field, other areas of the spatial frequency/time range than in the case of negative polarity are recorded, so that the time for the recording of the samples allocated to this range is halved.

BRIEF DESCRIPTION OF THE DRAWING

The invention is explained in greater detail below, with reference to the drawings. In the drawings.

DESCRIPTION OF THE PREFERRED EMBODIMENT

Figure 1:
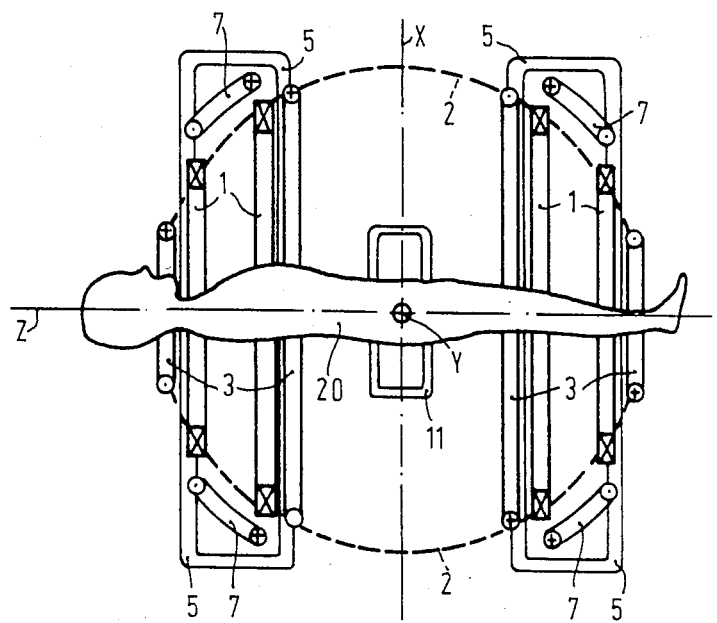
FIG. 1 shows a nuclear spin investigation device, in which the invention is applicable.

The nuclear spin tomography device schematically shown in FIG. 1 includes an arrangementg, consisting of four coils 1, for the generation of a homogeneous steady magnetic field, which can be of the order of magnitude of a few tenths Tesla to a few Tesla. This field extends in the z-direction of a Cartesian coordinate system. The coils 1, which are disposed concentrically in relation to the z-axis, can be disposed on a spherical surface 2. The patient 20, to be investigated, is situated within these coils.

For the generation of a magnetic field Gz, which extends in the z-direction and which varies linearly in this direction, four coils 3 are preferably disposed on the same spherical surface. Furthermore, four coils 7 are provided, which generate a magnetic field Gx, which likewise extends in the z-direction and the gradient of which does however extend in the x-direction.

A magnetic field Gy, which extends in the z-direction and which has a gradient in the y-direction, is generated by four coils 5, which can be identical with the coils 7, but which are disposed so as to be spatially rotated by 90° relative to the latter. Of the four coils 5, only two are shown in FIG. 1.

Since each of the three coil arrangements 3, 5 and 7 for the generation of the magnetic gradient fields Gz, Gy and Gx is disposed symmetrically in relation to the spherical surface 2, the field strength at the centre of the sphere, which centre forms at the same time the coordinate origin of the Cartesian x, y, z-coordinate system, is determined only by the steady homogeneous magnetic field of the coil arrangement 1. Furthermore, a high-frequency coil 11 is disposed symmetrically in relation to the z=0 plane of the coordinate system, and this is designed in such a manner that on this basis a substantially homogeneous high-frequency magnetic field is generated, extending in the x-direction, i.e. perpendicular to the direction of the steady homogeneous magnetic field. A high-frequency modulated current is fed to the high-frequency coil from a high-frequency generator during each high-frequency pulse. Following one or more high-frequency pulses, the high-frequency coil 11 serves for the reception of the echo signals generated by nuclear spin resonance in the region under investigation. In place of this, however, it is also possible to employ a separate high-frequency receiving coil.

Figure 2:
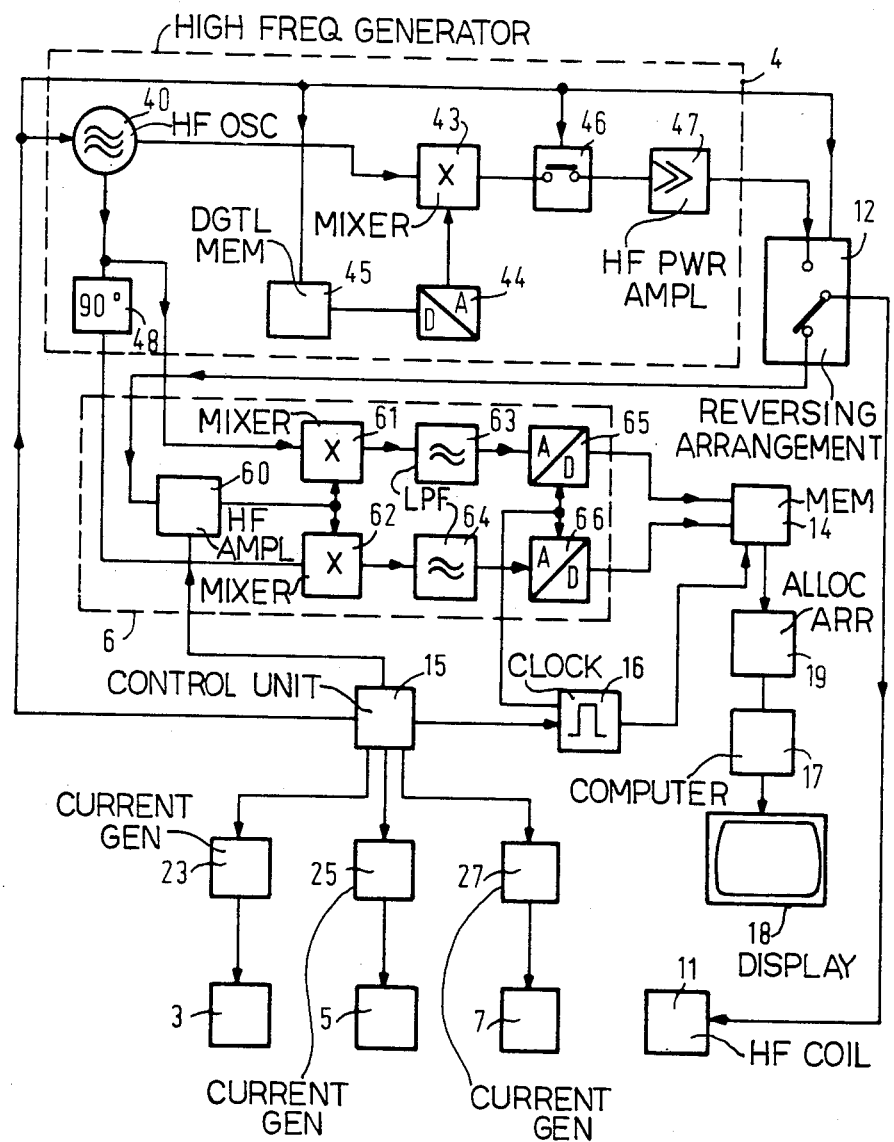
FIG. 2 shows a block diagram of such a device.

FIG. 2 shows a simplified block diagram of this nuclear spin tomography apparatus. The high-frequency coil 11 is connected via a reversing arrangement 12 on the one hand to a high-frequency generator 4 and on the other hand to a high-frequency receiver 6.

The high-frequency generator 4 includes a high-frequency oscillator 40, which exhibits oscillations with a frequency equal to the Larmor frequency of the hydrogen protons at the field strength generated by the coils 1; at a field strength of 0.5 Tesla, this frequency amounts to approximately 21.3 MHz, and at 2 Tesla to approximately 85 MHz. The output of the oscillator 40 is connected to an input of a mixer stage 43. To the mixer stage 43 there is fed a second input signal from a digital to analog converter 44, the input of which is connected to a digital memory 45. A sequence of digital data words representing an envelope curve signal is read out—controlled by a control arrangement 15—from the memory 45.

The mixer stage 43 processes the input signals fed to it in such a manner that the carrier oscillation modulated by the envelope curve signal appears at its output. In this connection, the envelope curve signal is selected in such a manner that the result is a perferably amplitude-modulated signal, the bandwidth of which is relatively large. The output signal of the mixer stage 43 is fed, via a switch 46 controlled by the control arrangement 15, to a high-frequency power amplifier 47, the output of which is connected to the reversing arrangement 12. The latter is likewise controlled by the control arrangement 15.

The receiver 6 includes a high-frequency amplifier 60, which is connected to the reversing arrangement 12 and to which the echo signals which are induced in the high-frequency coil 11 and which are generated by nuclear spin resonance are fed, when the reversing arrangement 12 is appropriately controlled. The amplifier 60 possesses a quiet switching input, which is controlled by the control arrangement 15 and by means of which it can be blocked, so that the amplification is practically zero. The output of the amplifier 60 is connected to the first inputs of two multiplicative mixer stages 61 and 62, which supply in each instance an output signal corresponding to the product of their input signals. A signal having the frequency of the oscillator 40 is fed to the second input of the mixer stages 61 and 62; in this connection, a phase shift of 90° exists between the signals at the two inputs. This phase shift is generated by means of a 90° phase shifting element 48, the output of which is connected to the input of the mixer stage 62 and the input of which is connected to the input of the mixer stage 61 and to the output of the oscillator 40.

The output signals of the mixer stages 61 and 62 are fed to respective analog to digital converters 65 and 66 respectively, via low-pass filters 63 and 64, which suppress the frequency supplied by the oscillator 40 as well as all frequencies higher than the same, and transmit only low-frequency components. The latter converters convert the analog signals of the circuit 61 . . . 64 forming a quadrature demodulator into digital data words, which are fed to a memory 14. The analog to digital converters 65 and 66 as well as the store 14 receive their clock pulses from a clock pulse generator 16, which can be blocked or cleared via a control line by the control arrangement 15, so that only in a measurement interval defined by the control arrangement 15 can the signals which are supplied by the high-frequency coil 11 and which are transposed into the low-frequency range be converted into a sequence of digital data words and stored in the memory 14.

The three coil arrangements 3, 5 and 7 are supplied in each instance, by current generators 23, 25 and 27, with a current, the temporal progression of which is controllable by the control unit 15. The digital samples stored in the memory 14 are fed, via an allocation arrangement 19, the function of which will be explained subsequently, to a computer 17, which, by reference to the samples, determines the spatial distribution of the nuclear magnetization in the region under investigation and outputs the determined distribution to an appropriate reproduction unit, e.g. a monitor 18.

Figure 3:
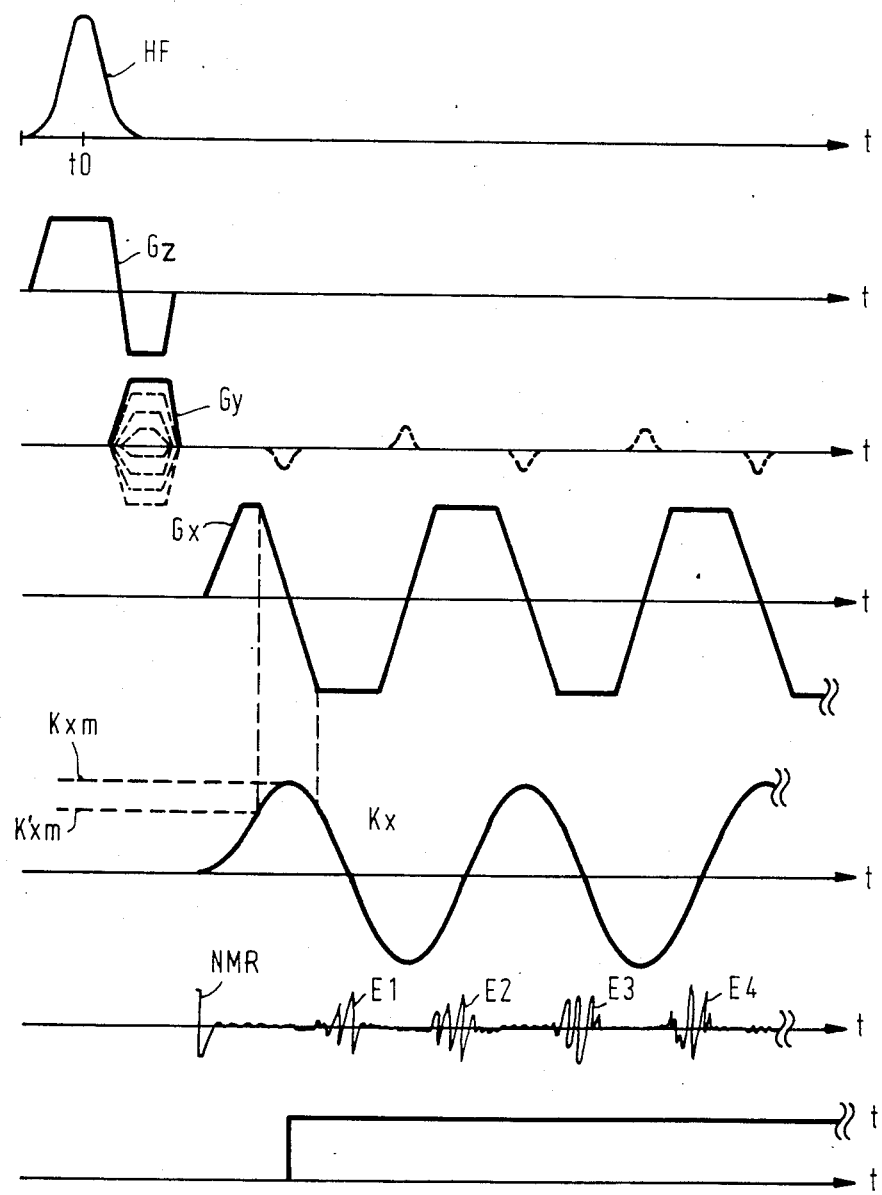
FIG. 3 shows the temporal progression of differing signals in a sequence according to the invention.

FIG. 3 shows the temporal progression of various signals received or generated with the circuit according to FIG. 2, for a single sequence.

When the high-frequency coil 11 is coupled with the high-frequency generator 4 via the switch 12, a high-frequency pulse is generated, which is schematically represented in the first line of FIG. 3. Preferably, this comprises a 90° pulse, which flips the nuclear magnetization in the region under investigation by 90°. However, the sequence can also comprise two high-frequency pulses, e.g. a 90° pulse and subsequently a 180° pulse (spin echo technique).

The second line shows the temporal progression of the gradient field Gz generated by the coil arrangement 3. This gradient field is effective during the high-frequency pulse with a first polarity and subsequently with the opposite polarity. In this procedure, the temporal progression is selected in such a manner that the temporal integral over the gradient field Gz from the centre of the high-frequency pulse to the switching off of this gradient field reaches precisely the value zero. The application of this gradient field brings about a situation in which the high-frequency pulse can excite only a defined layer. Since, as a result of this, a layer is thus selected, the designation "selection gradient" has also become established for this. Just like the temporal progression of the high-frequency pulse, the temporal progression of this gradient is the same for all sequences in the course of the investigation of a layer.

In the third line of FIG. 3, the temporal progression of the magnetic gradient field Gy generated by the coils 5 is represented. This field is effective following the high-frequency excitation pulse (first line) and its amplitude varies from sequence to sequence; the temporal interval between two successive sequences is of the order of magnitude of one second. Because the phase relation is influenced by means of this magnetic gradient field, this field is also designated as "phase encoding gradient".

The fourth line shows the temporal progression of the magnetic gradient field Gx generated by the coils 7. While this gradient field is present, the signal induced in the coil 11 is converted into digital samples in the high-frequency receiver 6. Accordingly, this gradient field is also designated as measurement gradient. This gradient field is actuated when the phase encoding gradient Gy is switched off. In this procedure, the polarity is reversed periodically from a positive value to a negative value; in this connection, the number of periods in a sequence is determined by the required spectral resolution; for example, if the sequence includes ten periods, then the nuclear magnetization within the bandwidth can be determined in ten spectral ranges.

The first positive half-oscillation of the measurement gradient Gx, which half-oscillation can also be applied as early as during the phase encoding interval, is shorter than the remaining half-oscillations of the measurement gradient, which are equal to one another. It is arranged in such a manner that the temporal integral over this gradient up to the centre of the first negative half-oscillation is zero. Typically, the time intervals in which the gradient Gx is constant amount to approximately 2 ms, and the reversal from the positive to the negative polarity and vice versa likewise lasts for 2 ms in each instance, so that the period of the oscillation—exhibiting a trapezoidal temporal progression—of the measurement gradient is 8 ms. This leads to a bandwidth of 125 Hz, within which the spectral distribution can be determined.

As is evident from the sixth line of FIG. 3, during each half-oscillation of the magnetic gradient field echo signals E1, E2, E3, E4 etc. are generated, whose maximum is situated in each instance at the centre of the time intervals in which the gradient is constant in each instance. In the seventh line of FIG. 3, the time interval is indicated during which the amplifier 60 is effective and by means of the analog to digital converters digital samples are generated and stored in the memory 14. In this procedure, there are also recorded the samples which occur in the course of the transition from the negative to the positive maximum value of the gradient.

In the fifth line, the temporal progression of the k value in the x-direction is represented and is designated there by kx. The k value is the product of the temporal integral over the magnetic gradient field Gx multiplied by the so-called gyromagnetic ratio, which in the case of hydrogen protons is approximately 42.5 MHz/Tesla. The k value can at the same time also be understood as the spatial frequency (cf. Med. Phys. 10 (5), September-/October 1983, pages 610 to 621). The kx value likewise has a periodic progression, with the same period as the magnetic gradient field with which it is associated; in this connection, its extreme values are at the zero passages of the gradient field and its zero passages are at the centre of the time interval during which the gradient is constant and positive or negative. During the last-mentioned interval, the k value proceeds linearly as a function of time; during the reversal phases, the k value has a nonlinear progression, e.g. a square progression, when the gradient varies linearly with time in the reversal phases. If the scanning values which occur during the reversal phase were to be disregarded in the reconstruction of the nuclear magnetization distribution, then the maximum attainable k value k'xm would be reduced to two thirds of the maximum k value kxm, which emerges when the samples during the reversal phase are also taken into consideration. As a result of this measure, the spatial resolution (i.e. the maximum spatial frequency) is thus improved by 50%.

FIG. 4 also shows once again the temporal progression kx of the k value in the x-direction during the first negative half-oscillation of the gradient field Gx, as well as an associated echo signal E1. This echo signal then appears, for example, at the output of the low-pass filter 63. At the output of the low-pass filter 64 there appears a second echo signal, which is sampled at the same points in time as E1 and which forms, together with E1, a complex echo signal. A k value can be allocated to each sampling point in time in which the echo signal E1 (at the output of one of the low-pass filters 63 and 64) is converted into a digital samples, so that the sequence of the samples in the time range are allocated into a sequence of samples in the kx range or in the spatial frequency range. Because of the partially nonlinear dependence of the kx values on time, the sequence of the samples in the spatial frequency range has an irregular spacing if it is sampled equidistantly in the time range, and conversely a non-equidistant sampling in the time range is associated with an equidistant spacing of the support positions in the spatial frequency range. Since, however, the echo signal corresponds to the Fourier transform from the spatial range into the spatial frequency range, it is necessary to subject the samples in the spatial frequency range to a Fourier transformation, in order to obtain the spatial distribution of the nuclear magnetization in the region under investigation.

For this purpose, the echo signal can be sampled in such a manner (more closely at the centre than at the beginning and at the end) that the samples are equidistant in the kx range, because in those circumstances a Fourier transformation can be applied without further ado. This would, however, presuppose that the clock pulse generator 16, which controls the memory 14 and the analog to digital converters 65 and 66, exhibits an appropriately variable clock frequency.

A possibility which is simpler from the point of view of technical circuit design consists in carrying out the sampling at constant time intervals $t_m$ (cf. FIG. 4), a non-equidistant sequence of the support positions being provided in the k range. In the periodical "NTZ-Archiv" (NTZ Archive), Vol. 3, 1981, No. 2, pages 35 to 38, there is however described a transformation method which can also be used in the case of samples at non-equidistant support positions.

Figure 4:
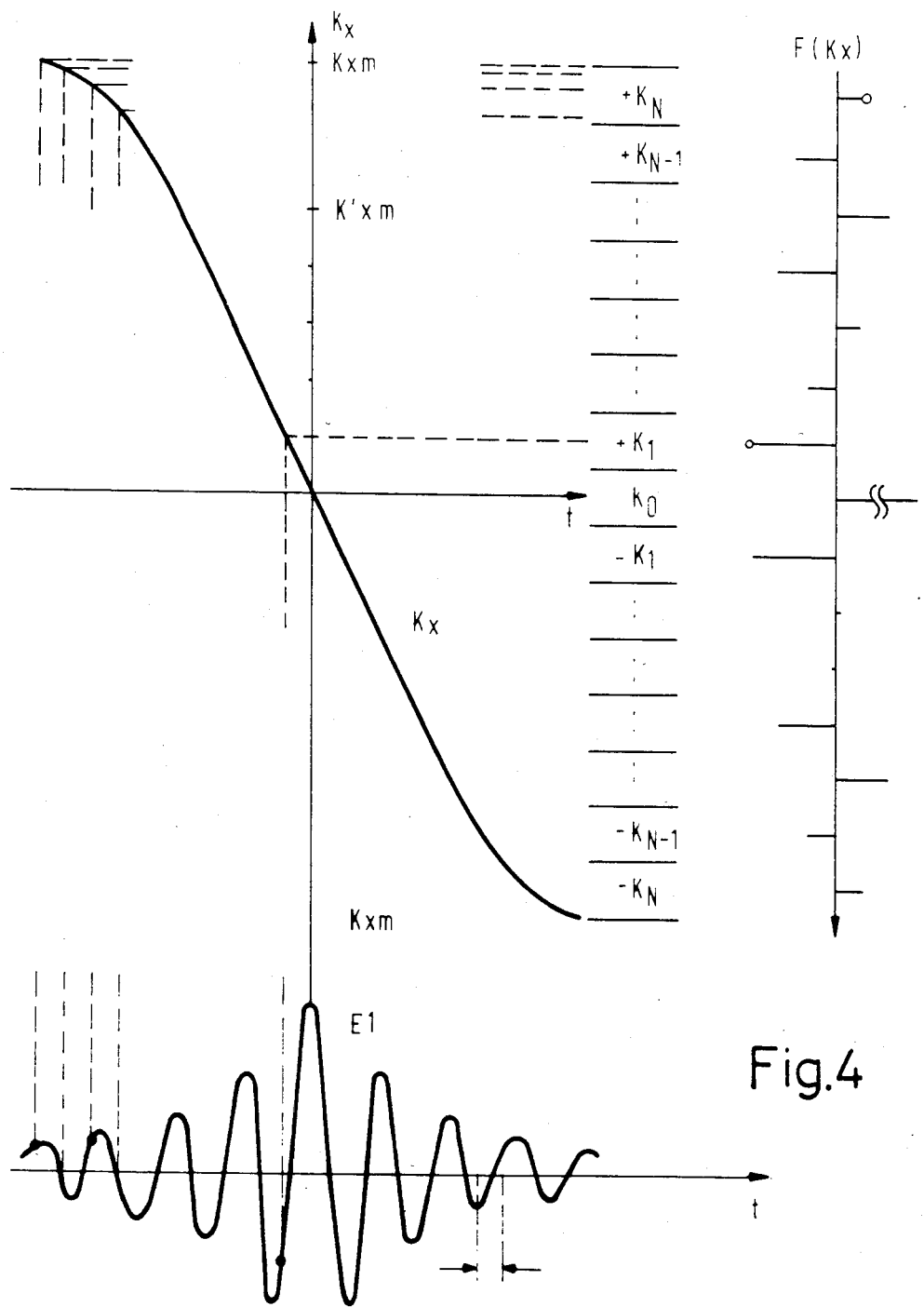
FIG. 4 shows the allocation of the samples to the spatial frequency range.

A further possibility, which is explained with reference to FIG. 4, consists in subdividing the spatial frequency range from $-k_{xm}$ to $k_{xm}$ into $2N+1$ equally large k or spatial frequency intervals $-kN \ldots k0 \ldots +kN$; in this connection, $2N+1$ is the number of pixels, in which connection N is, in practice, greater than is evident from FIG. 4, for example $N=64$. Expediently, the number of samples is selected to be so high that at least one sample falls within each k interval. With the indicated temporal progression of the gradient field Gx, this is the case in circumstances in which in the time range $8N/3+1$ equidistant samples of the echo signal E1 are undertaken. As is evident from FIG. 4, the number of samples which fall within the spatial frequency interval allocated to the higher spatial frequencies is greater than 1; for the interval $+kN$ ($-kN$) the result is, for example, four samples. If several samples fall within a spatial frequency interval, a resulting sample is determined by mean value formation and allocated to the pertinent spatial frequency interval. By this means, the signal/noise ratio for this spatial frequency range is improved. This results in the formation of the sequence F(kx) of samples with equidistant support positions in the k range, which sequence is shown in FIG. 4. The described allocation takes place by means of the allocation arrangement 19; in an appropriate case, this can also be carried out by the computer 17.

The sequence explained with reference to FIG. 4 relates only to the samples of a single echo signal. If the samples of the echo signal E3 and all further echo signals which are allocated to a negative gradient are evaluated in the same manner, the result is a two-dimensional array of samples F(kx, t), which are a function of the spatial frequency in the lower x-direction and of the time t. The time values which are allocated to the various echos are distinguished, in this procedure, in each instance by one period.

If, in this manner, each second echo signal of a sequence is converted into a sequence F(kx,t) of samples, this is repeated for the other sequences, in which—cf. FIG. 3—the magnitude of the gradient Gy is varied from sequence to sequence. The variation of the amplitude of the phase coding gradient Gy corresponds to a variation of the k value in the y-direction—hereinafter referred to as ky—so that, in the final analysis, a three-dimensional array of respectively equidistant samples F(kx,ky,t) emerges, from which, after the performance of a three-dimensional discrete Fourier transformation, the nuclear magnetization distribution f(x,y,v) can be determined as a function of the position x,y and of the frequency v.

Figure 5:
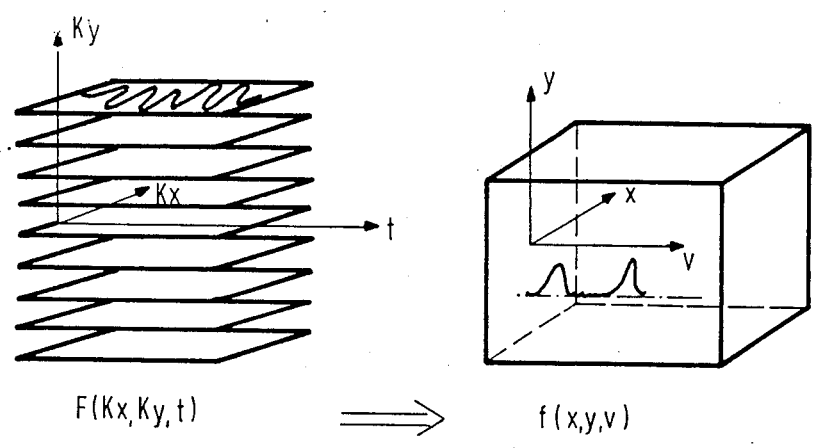
FIGS. 5 and 6 show the recording of the samples in the spatial frequency/time range in the case of a preferred embodiment of the method.

The recording of the samples and the reconstruction—which is thus possible—of the spatial and spectral distribution of the nuclear magnetization are explained with reference to FIG. 5, in which the recording of the samples in the kx, ky, t space is shown on the left. Following this, in each sequence a kx,t-plane is periodically sampled, and this is repeated in each sequence for another ky. In this procedure, the number z of samples amounts to z=(2N+1)Mp, where 2N+1 is the number of samples which are allocated to an echo signal in the kx range, M is the number of sequences, which is preferably equal to the number 2N+1, and p is the number of periods of the gradient Gx in a sequence. From these z samples, the nuclear magnetization at the points of a grid with 2N+1 points in the x-direction, M points in the y-direction and p points in the v-direction may be determined by the abovementioned three-dimensional discrete Fourier transformation.

With the aid of the values thus determined, images of the spatial distribution of the nuclear magnetization may be generated for a defined frequency, which corresponds, for example, to the Larmor frequency of the hydrogen protons bound to fat or to water, so that separate fat and water images can be obtained. It is, however, also possible to indicate the spectral distribution of the nuclear magnetization for a determined point, and thus the composition of the tissue at this point.

If the steady magnetic field is not homogenous in the region under investigation, the maxima of the nuclear magnetization are not located at the same position of the spectral range. In the case of recording methods having a low spectral resolutions, e.g. the Dixon method (Dixon and Faul, "Proton Spectrographic Imaging at 0.35T", 3rd Annual Meeting of SMRM, 1984), which resolves only two spectral points, this could lead to errors in the separation of fat and water images. With the method according to the invention, this space-dependent displacement of the spectrum can be corrected in the course of reconstruction, because the inhomogeneity of the magnetic gradient field of the coil remains the same and can be recorded using measurement technology.

In the method according to the invention, M sequences are required for the determination of the spectral and spatial distribution of the nuclear magnetization, where M amounts, for example, to 128. If the temporal interval between the commencement of two successive sequences amounts, for example, to one second, this means that the required measurement can be performed in only approximately two minutes.

As mentioned above, the reconstruction of the nuclear magnetization distribution requires only the conversion of every second echo signal, so that it is, in principle, possible to dispense with the sampling of the echo signals situated therebetween. However, if these are also sampled and separately subjected to a Fourier transformation, this gives a nuclear magnetization distribution f'(x,y,v) which would coincide with the distribution f(x,y,v) if the echo signals were not disturbed by noise. Accordingly, the signal/noise ratio can be improved if the values f(x,y,v) and f'(x,y,v) are added to one another.

Figure 6:
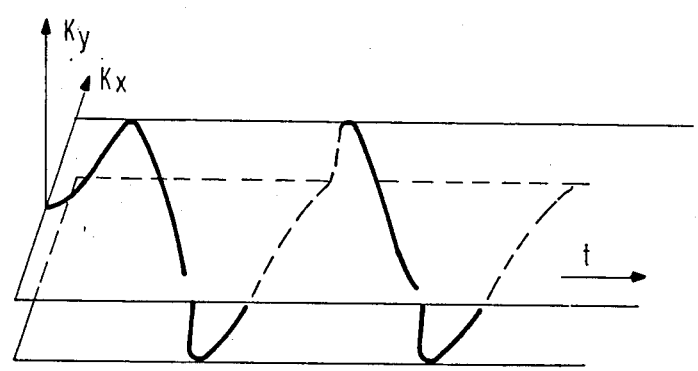

It is, however, also possible to make use of the fact that only every second echo signal is required for the reconstruction of the nuclear magnetization in a kx-t-plane, in order to record two such planes with one sequence. As is indicated in broken lines in FIG. 3, line three, for this purpose during the reversal phases of the gradient field Gx the gradient field Gy is switched on alternately with positive and negative polarity in such a manner that the temporal integral over the magnetic gradient field during such a reversal phase amounts to +ky/M or −ky/M, where ky is the greatest k value of all sequences in the y-direction and M indicates the number of points in the y-direction for which the nuclear magnetization is to be determined. The action of this measure is explained in FIG. 6, which shows two adjacent kx-t-planes. During the negative half-oscillation of the gradient Gx, where the kx value diminishes, the gradient field Gy does not in the first instance vary, so that samples in the upper kx-t-plane are recorded. At the end of this half-oscillation, the ky value is reduced by ky/M, and in the following positive half-oscillation of the gradient field Gx (rising progression of the kx values) the scanning values in the adjacent plane situated below the same are recorded. At the end of this half-oscillation, scanning again takes place in the plane situated above the same, etc.

Even when the gradient field Gy applied in the reversal phases is relatively small, the transition from one plane to the other cannot take place with arbitrary rapidity. In consequence of this, during the reversal phases a part of the area situated between the two planes is also transversed; in this connection, a part of the samples recorded in this procedure is allocated to the upper plane, and the other part to the lower plane. However, this has scarcely any effect on the image quality, because the nuclear magnetization distribution in adjacent planes is at least approximately the same.

Figure 7:
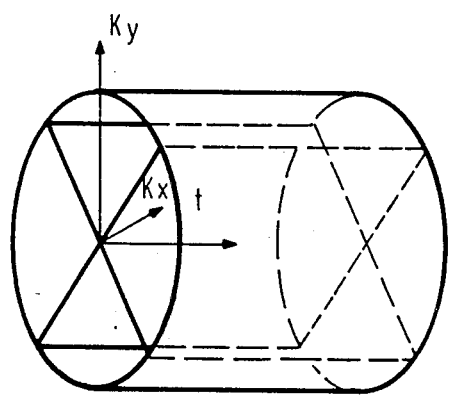
FIG. 7 shows the recording of the samples in the spatial frequency/time range in the case of another variant.

In the above text, the invention has been explained in conjunction with a multi-dimensional Fourier transformation method, but the invention is not restricted to this. It can also be employed in conjunction with a projection method, in which connection, from sequence to sequence, the magnitude of the gradient fields is not varied but their direction. In this case, both in the x and also in the y-direction, mutually synchronous periodic gradient fields must be applied, the magnitude of which is varied from sequence to sequence in opposite sense in steps, so that the sum of the squares remains constant over the maxima of the gradients Gx, Gy. In a method of such a type, the samples would be recorded in the kx-ky-t scanning space not on paralled planes, but on planes which intersect in the straight line kx=ky=0 (cf. FIG. 7). In this case also, the measuring time could be halved if angularly adjacent planes were scanned by the two half-oscillations. For this purpose the gradients within the sequence would have to be varied slightly from half-oscillation to half-oscillation.

According to FIG. 3, each sequence comprises only a single high-frequency pulse, but it is also possible to employ sequences with several high-frequency pulses, e.g. with a 90° pulse and a following 180° pulse (spin echo method) or sequences with three successive high-frequency pulses (stimulated echo method).

As has already been mentioned, in the method according to the invention the spectroscopically resolvable bandwidth corresponds to the reciprocal of a period (in the indicated example 125 Hz). If in the region under investigation substances are present which supply a significant contribution to the echo signal and the frequency interval of which is greater than the bandwidth, then the spectra of these substances are folded back on one another (back-folding). In such cases, a spectral separation is no longer possible. The frequency interval between two substances is proportional to the strength of the steady homogeneous magnetic field. In the case of a steady magnetic field of 0.5 Tesla, the difference in Larmor frequencies of hydrogen protons bound to water on the one hand and of hydrogen protons bound to fat on the other hand amounts to 70 Hz. In the case of a steady magnetic field of Tesla, this frequency interval does however even amount to approximately 280 Hz, so that a spectroscopic separation of fat and water is no longer possible.

Figure 8:
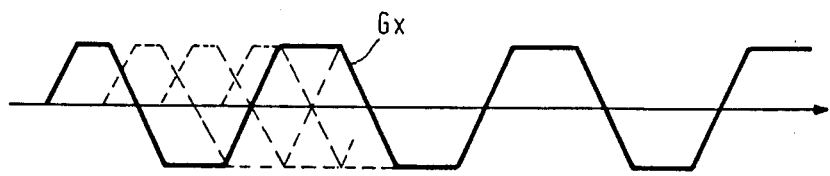
FIG. 8 shows the temporal progression of the periodic gradient field in the case of an embodiment which gives an increased bandwidth.

In order to be able to separate fat and water spectroscopically, even in this case, the bandwidth is multiplied by means of a method known per se (cf. "J. Magn. Reson." pages 167 to 171 (1985). In this procedure, each sequence is repeated n times (where n is an integer greater than 1); in this connection, only the interval between the high-frequency pulse and the periodic gradient field Gx is varied, from sequence to sequence, by the amount T/n, as indicated in broken lines in FIG. 8. Accordingly, if a gradient field Gx is switched on with a period of 8 ms in four sequences, where the interval in relation to the high-frequency excitation pulse is varied in each instance by 2 ms, then this results in a multiplication of the bandwidth (to 500 Hz), as well as a four times greater number of spectral values, but also a measuring time which is four times as great.

What is claimed is:

1. In a method for the determination of the spatial and of the spectral distribution of nuclear magnetization in a region under investigation, in which, in the presence of a homogeneous steady magnetic field, a number of sequences act on the region under investigation, each sequence comprising at least one magnetic high-frequency pulse for the excitation of nuclear magnetic resonance and subsequently a plurality of periods of a magnetic gradient field (Gx) with a gradient having a periodically varying polarity, after which echo signals generated in the course of this procedure in the region under investigation are converted into digital samples and these are subjected to discrete Fourier transformation, the improvement comprising the steps of recording samples which occur when the gradient field is varying in addition to recording samples which occur when the gradient field is constant, allocating the recorded samples to the spatial frequency range and transforming the samples into the spatial range by the Fourier transformation.

2. The method according to claim 1 further comprising the steps of allocating the samples to a spatial frequency grid with equally large intervals before the Fourier transformation.

3. The method according to claim 1 further comprising the step of applying in each sequence after the high-frequency pulse a magnetic gradient field (Gy), the gradient of which extends in a direction perpendicular to the direction of the periodic gradient field (Gx) and the amplitude and/or duration of which is varied from sequence to sequence.

4. The method according to one of claims 1 to 3, comprising n similar sequences, which are distinguished from one another only in that the temporal interval between the high-frequency pulse and the applying of the periodic gradient field is varied in each instance by the period of time T/n, where n is an integer greater than 1 and T is the period of the magnetic gradient field.

5. In a method for determination of the spatial and of the spectral distribution of the nuclear magnetization in a region under investigation, in which, in the presence of a homogeneous steady magnetic field, a number of sequences act on the region under investigation, each sequence comprising at last one magnetic high-frequency pulse for the excitation of nuclear magnetic resonance and subsequently a first gradient field reversed between a positive gradient and a negative gradient, after which the echo signals generated in the course of this procedure in the region under investigation are converted into digital samples and these are subjected to a discrete Fourier transformation, the improvement comprising the steps of generating a second magnetic gradient field, the gradient of which extends perpendicular to the gradient of the first gradient field, reversing the second gradient field synchronously with the first gradient field, the variation of the temporal integral over the gradient of the second gradient field being small in comparison with the temporal integral over the resultant gradient of both gradient fields, converting echo signals occurring during a positive gradient of the first magnetic gradient field into first digital samples and converting echo signals occurring during a negative gradient of the first magnetic gradient field into second digital samples and separately subjecting said first and second digital samples to a Fourier transformation.

6. The method according to claim 5, wherein during the reversal phase of the first magnetic gradient field the second gradient field is applied with polarity alternating from reversal phase to reversal phase, its gradient being small in comparison with the gradient of the first gradient field.

7. In an arrangement for carrying out a method for the determination of the spatial and of the spectral distribution of the nuclear magnetization in a region under investigation, said arrangement having a magnet for the generation of a homogeneous steady magnetic field, a high-frequency coil for the generation of high-frequency excitation pulses, gradient coils for the generation of magnetic gradient fields with gradients extending in differing directions, a control arrangement for the control of the temporal progression of the fields generated by the gradient coils, an analog to digital converter arrangement for the generation of digital samples from echo signals, a memory for receiving the samples and a computer for carrying out a Fourier transformation with the samples, the improvement comprising the control arrangement (15) controlling at least one of the gradient coils (7) to generate a periodic magnetic field (Gx) with a temporal progression of non-quadrangular form, controlling the analog to digital converter arrangement (65, 66) to generate digital samples during the periods of time with a non-constant gradient from the echo signals (E1, E3 ... ), store the digital samples in the memory and further comprising means (19) for converting the sequence of the digital samples into a sequence of values (F(kx, ... )) which is equidistant in the spatial frequency range, which values are fed to the computer for the Fourier transformation from the spatial frequency range into the spatial range.

8. In an arrangement for carrying out a method for the determination of the spatial and of the spectral distribution of the nuclear magnetization in a region under investigation, said arrangement having a magnet for the generation of a homogeneous steady magnetic field, a high-frequency coil for the generation of high-frequency excitation pulses, gradient coils for the generation of magnetic gradient fields with gradients extending in differing directions, a control arrangement for the control of the temporal progression of the fields generated by the gradient coils, an analog to digital converter arrangement for the generation of digital samples from echo signals, a memory for receiving the samples and a computer for carrying out a Fourier transformation with the samples, the improvement comprising the control arrangement (15) mutually synchronously periodic gradient fields are generated by two gradient coils (5, 7) and in that the computer for carrying out the Fourier transformation is dimensioned in such a manner that the digital samples of every second echo signal on the one hand and the digital samples of the remaining echo signals on the other hand are processed separately.

9. Arrangement according to one of claims 7 or 8, wherein the control arrangement is designed in such a manner that the temporal interval between the high-frequency excitation pulse and the switched-on period of the periodic gradient field is variable by the value T/n, where n is an integer and T is the period of the gradient field.

* * * * *